United States Patent
Nakajima et al.

(10) Patent No.: US 7,314,529 B2
(45) Date of Patent: *__Jan. 1, 2008__

(54) SUBSTRATE CLEANING APPARATUS AND SUBSTRATE CLEANING METHOD

(75) Inventors: Kazuo Nakajima, Kyoto (JP); Masanobu Sato, Kyoto (JP); Hiroaki Sugimoto, Kyoto (JP); Akio Hashizume, Kyoto (JP); Hiroki Tsujikawa, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/026,246

(22) Filed: Dec. 29, 2004

(65) Prior Publication Data

US 2005/0115596 A1  Jun. 2, 2005

Related U.S. Application Data

(63) Continuation of application No. 10/286,873, filed on Oct. 30, 2002.

(30) Foreign Application Priority Data

Nov. 2, 2001 (JP) ............ P2001-337738
Oct. 7, 2002 (JP) ............ P2002-293790

(51) Int. Cl.
*B08B 3/00* (2006.01)

(52) U.S. Cl. ............ 134/26; 134/2; 134/3; 134/28; 134/29; 134/33; 134/36; 134/37; 134/94.1; 134/95.3; 134/95.1; 134/98.1; 134/99.1; 134/102.1; 134/102.2; 134/103.2

(58) Field of Classification Search ............ 134/2, 134/3, 18, 33, 36, 37, 94.1, 95.1, 95.3, 98.1, 134/103.2, 902, 99.1, 102.1, 102.2, 181, 134/26, 28, 29
See application file for complete search history.

(56) References Cited

U.S. PATENT DOCUMENTS

| | | | | |
|---|---|---|---|---|
| 5,964,952 A | * | 10/1999 | Kunze-Concewitz | 134/2 |
| 6,247,479 B1 | * | 6/2001 | Taniyama et al. | 134/95.2 |
| 6,367,490 B1 | * | 4/2002 | Namba | 134/95.3 |
| 6,858,091 B2 | * | 2/2005 | Boyd et al. | 134/26 |
| 7,017,281 B2 | * | 3/2006 | Izumi | 34/565 |
| 2002/0035762 A1 | * | 3/2002 | Okuda et al. | 15/77 |

FOREIGN PATENT DOCUMENTS

KR  2003-0036087  5/2003

* cited by examiner

*Primary Examiner*—Zeinab El-Arini
(74) *Attorney, Agent, or Firm*—Ostrolenk, Faber, Gerb & Soffen, LLP

(57) ABSTRACT

A soft spray nozzle discharging a cleaning mist is vertically directed and fixed to an arm. A rinse nozzle discharging rinsing deionized water for suppressing obstruction is vertically fixed to the arm at a prescribed distance from the soft spray nozzle. During cleaning, it follows that both nozzles discharge detergents while keeping relative layout relation. Therefore, the discharged cleaning mist and rinsing deionized water do not interfere with each other before reaching the substrate but the used detergents are entirely horizontally splashed and recovered in a cup. Thus, the cleaning mist is prevented from scattering and adhering to the periphery.

7 Claims, 5 Drawing Sheets

[Fig. 1]
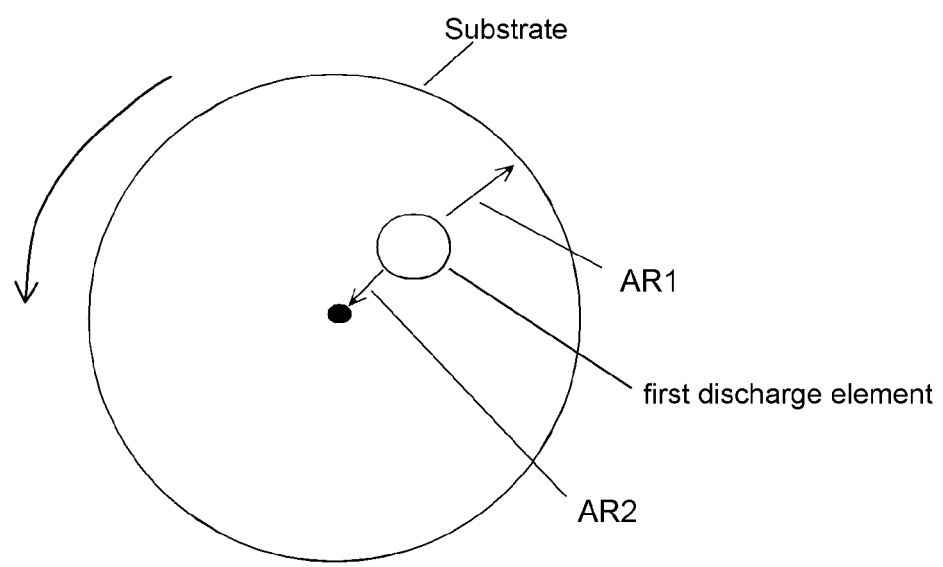
[Fig. 2]
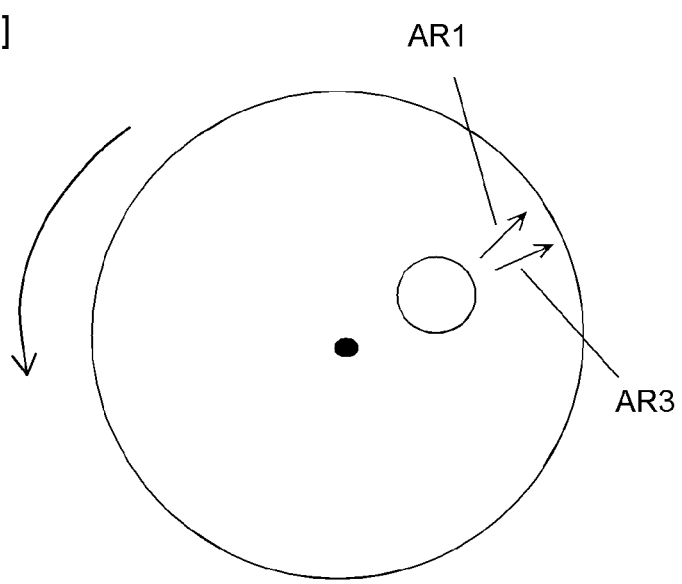

SUBSTRATE CLEANING APPARATUS AND SUBSTRATE CLEANING METHOD

CROSS-REFERENCE TO RELATED APPLICATIONS

This is a continuation of U.S. patent application Ser. No. 10/286,873, filed Oct. 30, 2002, in the name of Kazuo NAKAJIMA, et al. and entitled SUBSTRATE CLEANING APPARATUS AND SUBSTRATE CLEANING METHOD, which contents are incorporated herein by reference and claims priority to Japanese Application No. Ser. No. P2001-337738, filed Nov. 2, 2001 and Japanese Application No. Ser. No. P2002-293790, filed Oct. 7, 2002.

BACKGROUND OF THE INVENTION

1. Field of the Invention

The present invention relates to a substrate cleaning apparatus cleaning a semiconductor substrate, a glass substrate for a liquid crystal display, a glass substrate for a photomask or a substrate for an optical disk (hereinafter simply referred to as "substrate") held on a rotary base while rotating the same in a substantially horizontal plane.

2. Description of the Background Art

In general, the surface of the substrate must be kept extremely clean in a manufacturing process for the aforementioned substrate, and hence cleaning processing such as that or removing particles adhering to the surface of the substrate is performed in each of various steps in the manufacturing process.

A cleaning system discharging a cleaning mist prepared by mixing a detergent (or cleaning liquid) and pressurized gas with each other to the substrate through a double-fluid nozzle is known in relation to such cleaning processing.

This cleaning system not directly coming into contact with the substrate is capable of cleaning the substrate without physically damaging a pattern or the like. The discharge rate for the cleaning mist can be controlled with a relatively large variable width (from 30 m/s to about the sound velocity) by adjusting the flow rate of the gas, and hence cleaning can be performed in response to the object substrate by controlling the discharge rate.

When the discharge rate for the cleaning mist is increased to about the sound velocity, for example, a sufficient cleaning effect can be attained simply by using only deionized water as the detergent without using acid or alkali. When the discharge rate is relatively reduced to the contrary, a damage applied to the object substrate can be relatively reduced.

It has been proved that watermark defects are caused to increase the quantity of foreign matter when the aforementioned cleaning system is applied to an object substrate having a hydrophobic surface, for example. The number of such defects is increased toward the peripheral edge portion of the substrate subjected to relatively large centrifugal force resulting from rotation.

The inventor has made deep studies on the cause for the watermark defects, to find out that the cleaning mist reaching the substrate is splashed to adhere to the substrate again and dried as such to result in the watermark defects in the cleaning system discharging the cleaning mist prepared by mixing the detergent and the pressurized gas with each other to the substrate. It has also been proved that a small flow rate of the detergent also results in watermark defects in this cleaning system.

SUMMARY OF THE INVENTION

The present invention is directed to a substrate cleaning apparatus cleaning a substrate held on a rotary base while rotating the same in a substantially horizontal plane.

According to the present invention, the substrate cleaning apparatus comprises a first discharge element discharging a first detergent onto the substrate and forming a liquid film on the substrate and a second discharge element discharging a cleaning mist formed by mixing a second detergent and pressurized gas with each other onto the substrate formed with the liquid film.

The substrate cleaning apparatus is so formed as to discharge the cleaning mist from the second discharge element onto the substrate formed with the liquid film of the first detergent discharged from the first discharge element, whereby the substrate can be prevented from formation of watermark defects.

Preferably, the first discharge element is moved to form the liquid film of the first detergent on a prescribed region of the substrate, the second discharge element is so moved that a reaching point of the cleaning mist on the substrate passes through the rotation center of the substrate, and the first and second discharge elements are so moved that the first detergent and the cleaning mist do not interfere with each other before reaching the substrate.

The cleaning mist can be prevented from scattering resulting from interference with the first detergent.

According to an aspect of the present invention, the substrate cleaning apparatus comprises a first discharge element discharging a first detergent onto the substrate for forming a liquid film on the substrate, a second discharge element discharging a cleaning mist formed by mixing a second detergent and pressurized gas with each other onto the substrate formed with the liquid film, an arm having a forward end fixedly provided with the first and second discharge elements at a prescribed space, and a rotation element rotating the arm so that both of the first and second discharge elements pass through the rotation center of the substrate.

The substrate can be prevented from formation of watermark defects, while the first and second discharge elements are fixed at a prescribed space and hence the cleaning mist and the first detergent can be prevented from interfering with each other before reaching the substrate. Consequently, the cleaning mist can be prevented from scattering resulting from interference with the first detergent.

The present invention is also directed to a substrate cleaning method of cleaning a substrate held on a rotary base while rotating the same in a substantially horizontal plane.

Accordingly, an object of the present invention is to provide a substrate cleaning apparatus capable of preventing formation of watermark defects in a cleaning system discharging a cleaning mist to a substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 schematically illustrates the structure of a substrate cleaning apparatus according to a first embodiment of the present invention;

FIG. 2 is a schematic sectional view of a soft spray nozzle;

DESCRIPTION OF THE PREFERRED EMBODIMENTS

Figure 3:
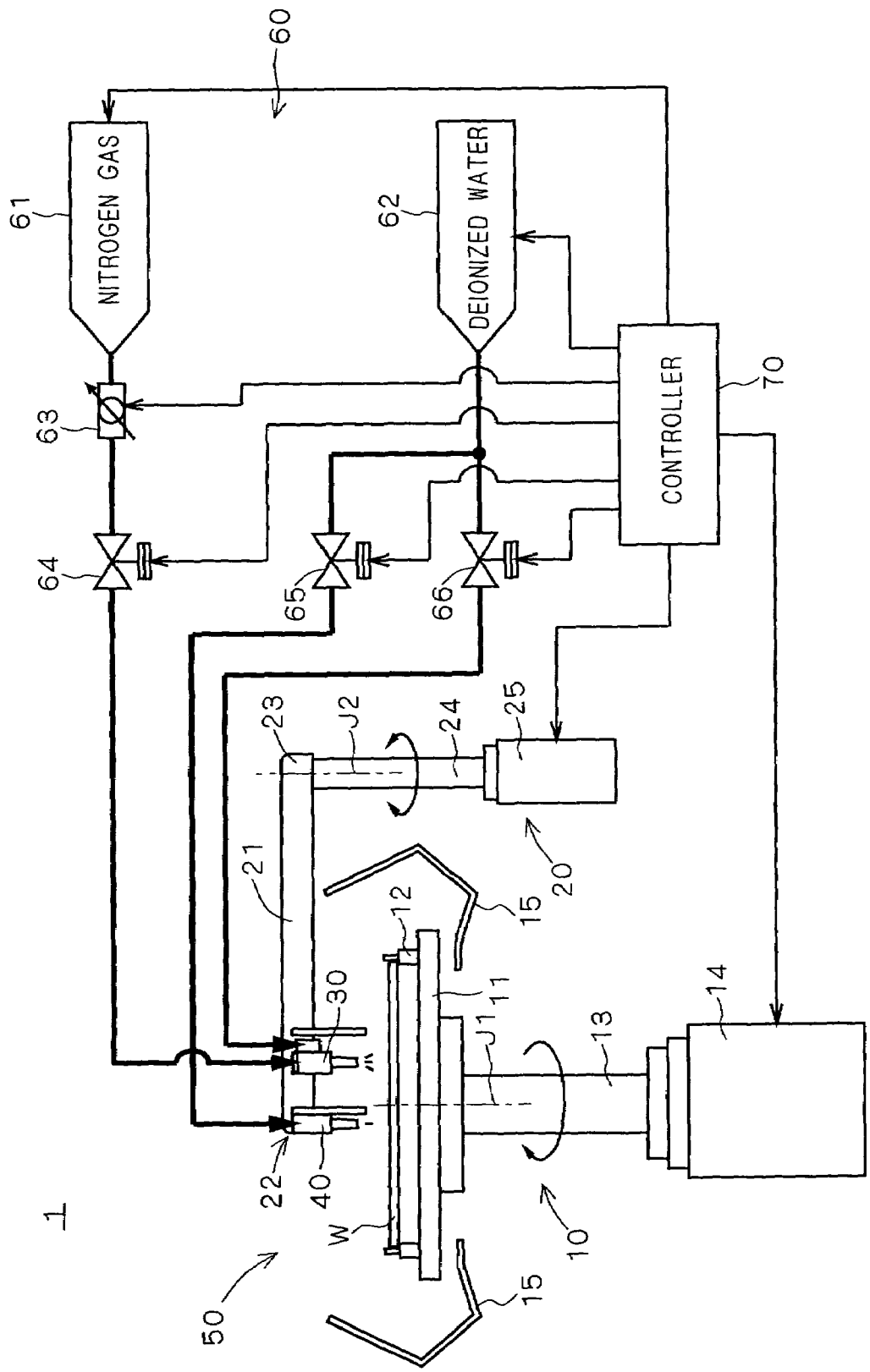
FIG. 3 schematically illustrates the structure of a substrate cleaning apparatus according to a second embodiment of the present invention.

Embodiments of the present invention are now described with reference to the drawings.

1. First Embodiment

FIG. 1 is schematically illustrates the structure of a substrate cleaning apparatus 200 according to a first embodiment of the present invention. The substrate cleaning apparatus 200 is a single-substrate type substrate cleaning apparatus cleaning a substrate W by a cleaning system discharging a cleaning mist prepared by mixing a detergent and pressurized gas with each other to the substrate W through a double-fluid nozzle. The substrate cleaning apparatus 200 is formed to discharge deionized water (hereinafter also referred to as "rinsing deionized water") as a detergent covering the surface of the substrate W supplied with the cleaning mist, in order to suppress formation of the aforementioned watermark defects. The cleaning mist and the rinsing deionized water discharged to the substrate W are hereinafter generically referred to as "processing solution".

As shown in FIG. 1, a plurality of chuck pins 101 are uprightly provided on the upper surface of a spin base 100. The respective ones of the plurality of chuck pins 101 support the peripheral edge portion of the substrate W, thereby holding the substrate W in a horizontal posture separated from the spin base 100 at a prescribed space.

A rotary shaft 110 is suspended from the central portion of the lower surface of the spin base 100. This rotary shaft 110 is rotatable through a rotation driving mechanism (not shown). When the rotary shaft 110 is rotated, the spin base 100 and the substrate W held by the same are also rotated about a vertical axis in a horizontal plane. A cup 103 is arranged to enclose the spin base 100 and the substrate W held by the same.

A soft spray nozzle 30 is a double-fluid nozzle forming a cleaning mist by mixing nitrogen gas ($N_2$) and deionized water supplied from a nitrogen gas supply source (not shown) and a deionized water supply source (not shown) respectively with each other and discharging the same to the substrate W.

FIG. 2 is a schematic sectional view of the soft spray nozzle 30. As shown in FIG. 2, the soft spray nozzle 30 has a double pipe structure provided with a detergent introduction pipe 32 supplied with deionized water S and a gas introduction pipe 33, inserted in the detergent introduction pipe 32, supplied with nitrogen gas G. A mixing part 34 is provided in the detergent introduction pipe 32 downstream an end of the gas introduction pipe 33 for mixing the nitrogen gas G and the deionized water S with each other.

The mixing part 34 mixes the pressurized nitrogen gas G and the pressurized deionized water S with each other thereby forming a cleaning mist M. An accelerating tube 35 downstream the mixing part 34 accelerates the formed cleaning mist M, which in turn is discharged from a discharge port 31.

A shield 113 is provided around the soft spray nozzle 30 for preventing the cleaning mist M from diffusion. The soft spray nozzle 30 is fixed to a swing arm (not shown), which swings the soft spray nozzle 30 between the rotation center and the peripheral portion of the substrate W. Due to rotation of the substrate W, it follows that the cleaning mist M is discharged toward the overall substrate W.

A rinse nozzle 112 discharges deionized water to the substrate W to cover the surface of the substrate W. A support arm (not shown) supports the rinse nozzle 112 in an inclined posture directing its discharge port toward the rotation center of the substrate W. The deionized water discharged toward the rotation center of the substrate W spreads toward the peripheral portion of the substrate W due to rotational centrifugal force, thereby covering the overall surface of the substrate W.

Thus, it follows that the cleaning mist M is discharged onto the surface of the substrate W covered with the deionized water, i.e., formed with a liquid film of the deionized water, and part of the cleaning mist M plashed on the substrate W is prevented from directly re-adhering to the substrate W and being dried in this state, thereby suppressing formation of the aforementioned watermark defects.

2. Second Embodiment

A substrate cleaning apparatus 1 according to a second embodiment of the present invention is now described with reference to FIG. 3. Elements of the substrate cleaning apparatus 1 similar to those of the substrate cleaning apparatus 200 according to the first embodiment are denoted by the same reference numerals.

As shown in FIG. 3, the substrate cleaning apparatus 1 comprises a substrate cleaning part 50 mainly cleaning a substrate W, a processing solution supply part 60 supplying nitrogen gas ($N_2$) which is inert gas and deionized water serving as a detergent to the substrate cleaning part 50 and a controller 70 controlling the overall substrate cleaning apparatus 1.

The substrate cleaning part 50 is formed by a substrate rotation mechanism 10 mainly holding and rotating the substrate W and a processing solution discharge mechanism 20 discharging a processing solution to the substrate W held by the substrate rotation mechanism 10. The substrate rotation mechanism 10 comprises a spin base 11 holding the substrate W, a plurality of chuck pins 12 provided on the spin base 11, a rotation motor 14 rotating the spin base 11 and a cup 15 enclosing the substrate W held by the spin base 11.

The spin base 11 is a discoidal member provided with an upper surface having the plurality of chuck pins 12 uprightly provided for grasping the peripheral portion of the circular substrate W respectively. At least three chuck pins 12 may be provided for reliably holding the circular substrate W. FIG. 3 shows only two chuck pins 12 for convenience of illustration.

Each of the chuck pins 12 is switchable between a pressing state pressing the outer peripheral end surface of the substrate W for holding the substrate W and a releasing state releasing the outer peripheral end surface of the substrate W from pressure. When an uncleaned substrate W is transferred to the spin base 11 and a cleaned substrate W is taken out from the spin base 11, each chuck pin 12 is brought into the releasing state. When the substrate W is cleaned, on the other hand, each chuck pin 12 is brought into the pressing state. The plurality of chuck pins 12 brought into the pressing state grasp the peripheral portion of the substrate W and hold the substrate W in a horizontal posture at a prescribed space from the spin base 11.

A rotary shaft 13 is suspended from the central portion of the lower surface of the spin base 11, and a rotation motor 14 is coupled to the lower portion of the rotary shaft 13. When the rotation motor 14 is driven, the driving force is transmitted to the rotary shaft 13 for rotating the rotary shaft 13, the spin base 11 and the substrate W held by the same about a vertical axis J1 in a horizontal plane. This axis J1 is hereinafter also referred to as "the rotation center J1 of the substrate W".

The cup 15 receives the processing solution employed for cleaning the substrate W and guides the same to a discharge port (not shown). The cup 15 is coupled with a cup transport mechanism (not shown) to be vertically movable with respect to the spin base 11. When the substrate W is cleaned, the cup 15 is so arranged that the upper end thereof is located upward beyond the surface of the substrate W, to be capable of receiving the processing solution substantially horizontally splashed due to rotation of the substrate W.

The processing solution discharge mechanism 20 mainly comprises a soft spray nozzle 30 forming a cleaning mist by mixing deionized water and nitrogen gas with each other and discharging the cleaning mist toward the substrate W, a rinse nozzle 40 discharging rinsing deionized water to cover the surface of the substrate W supplied with the cleaning mist, an arm 21 holding the soft spray nozzle 30 and the rinse nozzle 40, and a rotation motor 25 rotating the arm 21.

The soft spray nozzle 30 and the rinse nozzle 40 are fixed to a forward end 22 of the arm 21, while a rotary shaft 24 is suspended from a base 23. The rotation motor 25 is coupled to the lower portion of the rotary shaft 24. The arm 21 is arranged above the surface of the substrate W so that the longitudinal direction thereof is along the horizontal direction. When the rotation motor 25 is driven, the driving force is transmitted to the arm 21 through the rotary shaft 24 for rotating the arm 21 along a vertical axis J2 in a horizontal plane. Due to this rotation of the arm 21, the soft spray nozzle 30 and the rinse nozzle 40 are also rotated about the axis J2 in a horizontal plane above the surface of the substrate W. This axis J2 is hereinafter also referred to as "the rotation center J2 of the arm 21".

The rinse nozzle 40 is connected to a deionized water feeder 62 of the processing solution supply part 60 through a switch-controlled control valve 65, to be supplied with deionized water from the deionized water feeder 62. The soft spray nozzle 30 is connected to the deionized water feeder 62 through a switch-controlled control valve 66 and connected to a gas feeder 61 through a switch-controlled control valve 64 and a pressure regulator 63. The pressure regulator 63 performs pressure regulation such as pressurization or decompression of the nitrogen gas. Thus, the soft spray nozzle 30 is supplied with the deionized water from the deionized water feeder 62 of the processing solution supply part 60 and supplied with the pressure-regulated nitrogen gas from the gas feeder 61.

The soft spray nozzle 30 comprises a structure similar to that in the first embodiment shown in the schematic sectional view of FIG. 2.

The controller 70 comprising a microcomputer supervises the operation of each processing part of the substrate cleaning apparatus 1. Operation control performed by the controller 70 includes rotation control of the aforementioned rotation motor 14, rotation control of the rotation motor 25, switch control of the control valves 64 to 66 and pressure regulation control of the pressure regulator 63.

Figure 4:
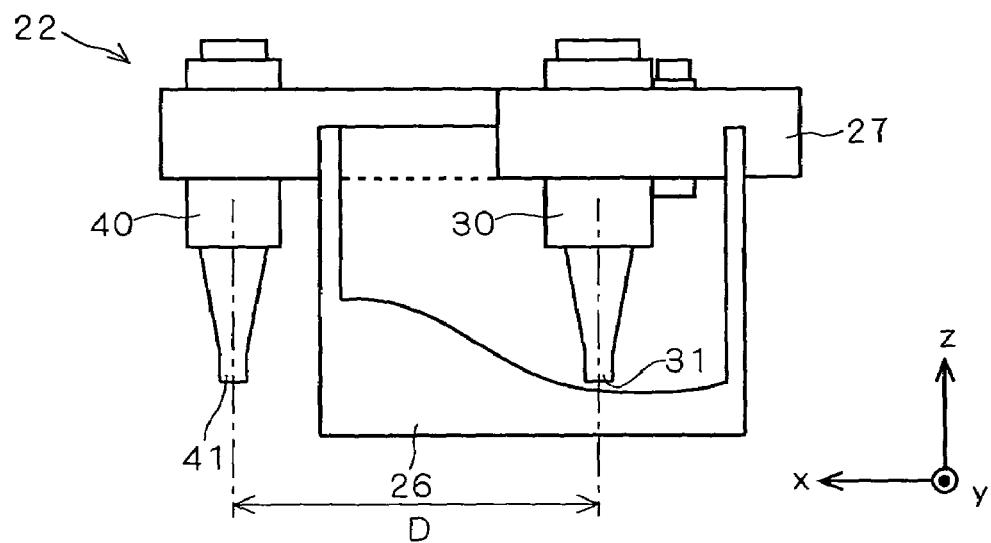
FIG. 4 is a front elevational view of the forward end of an arm.
Figure 5:
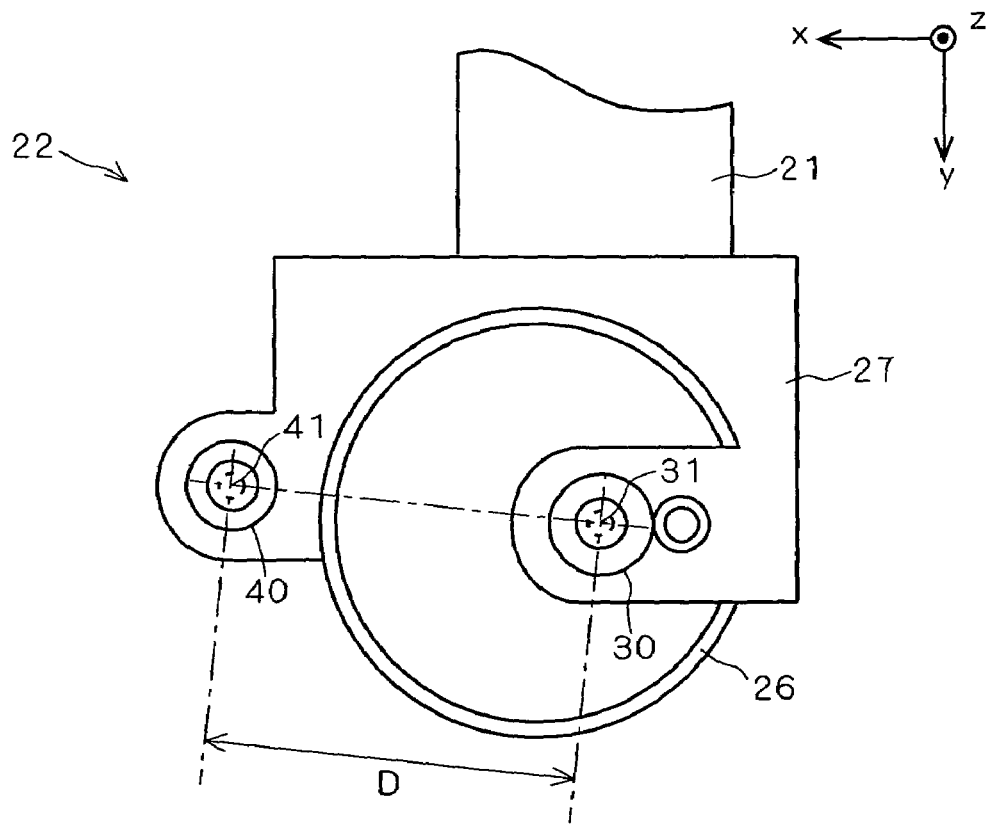
FIG. 5 is a top plan view of the forward end of the arm.

The arrangement relation between the soft spray nozzle 30 and the rinse nozzle 40 fixed to the forward end 22 of the arm 21 is now described. FIG. 4 is a front elevational view of the forward end 22 of the arm 21, and FIG. 5 is a top plan view of the forward end 22. FIG. 4 shows the forward end 22 as viewed from a direction y in FIG. 5, and FIG. 5 shows the forward end 22 as viewed from a direction z in FIG. 4. The rotation center J2 of the arm 21 is positioned in a direction (−y) in FIG. 5.

As shown in FIGS. 4 and 5, a vertically cylindrical shield 26 is provided on the forward end 22 of the arm 21 along with the soft spray nozzle 30 and the rinse nozzle 40. Further, a fixing member 27 is provided for fixing relative arrangement relation between the soft spray nozzle 30, the rinse nozzle 40 and the shield 26. The fixing member 27 is fixed to the arm 21, whereby it follows that the soft spray nozzle 30, the rinse nozzle 40 and the shield 26 are fixed to the arm 21 to hold the relative arrangement relation.

The shield 26 enclosing the soft spray nozzle 30 is so arranged that the lower end thereof is downward beyond a discharge port 31 of the soft spray nozzle 30. The rinse nozzle 40 is arranged outside the shield 26, to be separated from the soft spray nozzle 30 by the shield 26. Thus, the cleaning mist discharged from the soft spray nozzle 30 is prevented from diffusion to the periphery while the cleaning mist and the rinsing deionized water discharged from the rinse nozzle 40 are prevented from coming into contact with each other before reaching the substrate W.

The soft spray nozzle 30 and the rinse nozzle 40 are fixed to vertically direct the discharge port 31 and a discharge port 41 thereof respectively. In other words, reaching points (more correctly, center points of sets of the respective reaching points) of the cleaning mist and the rinsing deionized water on the substrate W are located immediately under the discharge ports 31 and 41 along the vertical direction respectively.

The soft spray nozzle 30 and the rinse nozzle 40 are so arranged that the discharge ports 31 and 41 thereof are horizontally separated from each other by a prescribed distance D. Thus, the space between the reaching points of the cleaning mist and the rinsing deionized water on the substrate W is identical to the distance D between the discharge ports 31 and 41. This distance D is so set that the cleaning mist and the rinsing deionized water do not interfere with each other before reaching the substrate W by actual measurement or the like.

Figure 6:
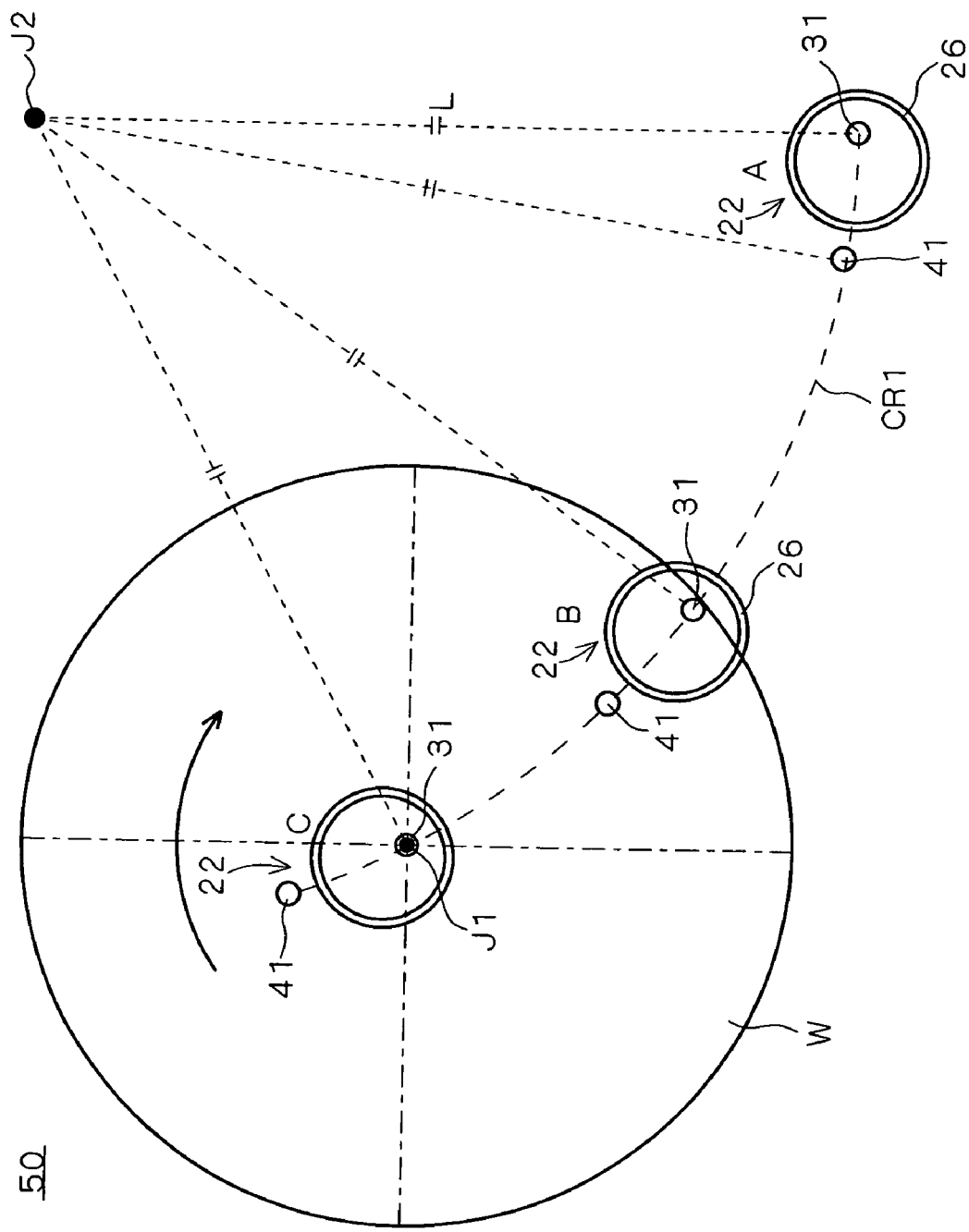
FIG. 6 is a top plan view of a substrate cleaning part.

FIG. 6 is a top plan view of the substrate cleaning part 50. For convenience of illustration, FIG. 6 shows only the substrate W as to the substrate rotation mechanism 10 while showing only the forward end 22 (the discharge ports 31 and 41 of the soft spray nozzle 30 and the rinse nozzle 40 and the shield 26) of the arm 21 as to the processing solution discharge mechanism 20.

Due to rotation of the arm 21, the forward end 22 of the arm 21 is rotated between positions A and C in FIG. 6. The position A is a shunt position for transferring the substrate W, and a position B and the position C are processing positions for cleaning the substrate W. As shown in FIG. 6, the rinse nozzle 40 is positioned closer to the rotation center J1 of the substrate W beyond the soft spray nozzle 30 when the forward end 22 of the arm 21 is located on the position A or B.

The discharge ports 31 and 41 of the soft spray nozzle 30 and the rinse nozzle 40 are arranged at the same distance L from the rotation center J2 of the arm 21. When the soft spray nozzle 30 and the rinse nozzle 40 are rotated due to rotation of the arm 21, rotation loci of the discharge ports 31 and 41 draw a circular arc CR1 on the same circumference. The substrate rotation mechanism 10 and the processing solution discharge mechanism 20 are so arranged that this circular arc CR1 passes through a portion immediately above the rotation center J1 of the substrate W, whereby it follows that the reaching points of the cleaning mist and the rinsing deionized water on the substrate W pass through the rotation center J1 of the substrate W respectively.

The discharge port 31 of the soft spray nozzle 30 is located immediately above the peripheral edge portion of the substrate W on the position B shown in FIG. 6, and located immediately above the rotation center J1 of the substrate W on the position C shown in FIG. 6.

Operation of cleaning the substrate W in the substrate cleaning apparatus I having the aforementioned structure is now described. Before starting this operation, the forward end 22 of the arm 21 is located on the shunt position A.

First, the cup 15 is moved down for projecting the spin base 11 from the cup 15. In this state, an uncleaned substrate W is transferred onto the spin base 11, and the chuck pins 12 grasp the peripheral edge of the substrate W thereby holding the substrate W in a horizontal posture.

Then, the forward end 22 of the arm 21 is moved to the position B. In other words, the discharge port 31 of the soft spray nozzle 30 is located immediately above the peripheral edge of the substrate W. The cup 15 is moved up to a prescribed position for rotating the spin base 11 as well as the substrate W held by the same at a constant speed.

In this state, the soft spray nozzle 30 and the rinse spray nozzle 40 simultaneously start discharging the cleaning mist and the rinsing deionized water respectively. The forward end 22 of the arm 21 is moved from the position B to the position C while the nozzles 30 and 40 discharge the detergents respectively.

After moved to the position C, the forward end 22 of the arm 21 is oppositely moved to the position B. This movement between the positions B and C is repeated by a prescribed number of times. In other words, it follows that the discharge port 31 of the soft spray nozzle 30 is rotated between the position immediately above the peripheral edge of the substrate W and the position immediately above the rotation center J1 of the substrate W.

The cleaning mist discharged from the soft spray nozzle 30 reaches the position immediately under the circular arc CR1 between the peripheral edge of the substrate W and the rotation center J1 of the substrate W due to the rotation of the forward end 22 of the arm 21. Due to rotation of the substrate W, it follows that the cleaning mist reaches the overall substrate W for cleaning the overall substrate W. The cleaning mist reaching the substrate W substantially horizontally splashes from the substrate W and is received in the cup 15 to be guided to a discharge port and discharged.

The rinsing deionized water discharged from the rinse nozzle 40 reaches a point separated from the reaching point of the cleaning mist by the distance D without interfering with the cleaning mist due to the distance D between the discharge ports 31 and 41. After reaching the substrate W, the rinsing deionized water spreads to form a liquid film covering a prescribed region of the surface of the substrate W in the peripheral edge direction (direction separating from the rotation center J1 of the substrate W) of the substrate W due to rotational centrifugal force. When reaching the peripheral edge of the substrate W, the rinsing deionized water substantially horizontally splashes as such and is received in the cup 15 to be guided to the discharge port and discharged.

When the forward end 22 of the arm 21 is located on the position B, the discharge port 41 is positioned closer to the rotation center J1 of the substrate W beyond the discharge port 31, and hence the rinsing deionized water spreading in the peripheral edge direction covers the reaching point of the cleaning mist for suppressing formation of watermark defects.

Until the discharge port 41 is located immediately above the rotation center J1 of the substrate W while the forward end 22 of the arm 21 is moved from the position B to the position C, the discharge port 41 is located closer to the rotation center J1 of the substrate W beyond the discharge port 31 and hence the reaching point of the cleaning mist remains in the state covered with the liquid film of the rinsing deionized water, thereby suppressing formation of watermark defects similarly to the above.

Before the intermediate position (more correctly, a position corresponding to the intermediate position along the circular arc CR1) between the discharge ports 41 and 31 is located immediately above the rotation center J1 of the substrate W after the discharge port 41 passes through the position immediately above the rotation center J1 of the substrate W, the distance between the rotation center J1 of the substrate W and the discharge port 41 is smaller than the distance between the rotation center J1 of the substrate W and the discharge port 31. Therefore, the rinsing deionized water spreading in the peripheral edge direction after reaching the substrate W flows due to rotation of the substrate W to cover the reaching point of the cleaning mist with a liquid film, thereby suppressing formation of watermark defects similarly to the above.

While the intermediate position between the discharge ports 41 and 31 passes through the position immediately above the rotation center J1 of the substrate W and the forward end 22 of the arm 21 is moved to the position C, the distance between the rotation center J1 of the substrate W and the discharge port 41 is larger than the distance between the rotation center J1 of the substrate W and the discharge port 31, and the rinsing deionized water does not temporarily cover the reaching point of the cleaning mist. However, a larger number of watermark defects are formed in the peripheral edge of the substrate W rotated at a relatively higher speed than the central portion of the substrate W to be readily dried while no defects are formed around the rotation center J1 of the substrate W.

Thus, while the forward end 22 of the arm 21 is moved from the position B to the position C, it follows that formation of watermark defects is suppressed on any position. Also while the forward end 22 of the arm 21 is moved from the position C to the position B, the relative arrangement relation between the discharge ports 41 and 31 and the substrate W is similar and hence formation of defects is similarly suppressed. In other words, it follows that formation of watermark defects is suppressed the whole time when the forward end 22 of the arm 21 is rotated.

Further, the relative arrangement relation between the soft spray nozzle 30, the rinse nozzle 40 and the shield 26 is held the whole time when the forward end 22 of the arm 21 is rotated, whereby the cleaning mist and the rinsing deionized water are prevented from interfering with each other before reaching the substrate W. Therefore, it follows that all processing solutions used for the cleaning processing substantially horizontally splash from the substrate W without splashing obliquely upward at wide angles, to be correctly received in the cup 15, guided to the discharge port and discharged.

When the forward end 22 of the arm 21 is rotated by a prescribed number of times, discharge of the cleaning mist and the rinsing deionized water is stopped. The substrate W is continuously rotated also after discharge from the nozzles 30 and 40 is stopped, and drying processing (spin dry processing) is performed for draining droplets adhering to the substrate W by rotational centrifugal force.

When the spin dry processing is terminated after a prescribed time, rotation of the spin base 11 and the substrate W held by the same is stopped. The cup 15 is moved down and the forward end 22 of the arm 21 is moved to the shunt position A. In this state, a transfer robot (not shown) takes out the cleaned substrate W from the spin base 11 and transfers the same, thereby terminating the series of cleaning processing.

In the substrate cleaning apparatus 1 according to the second embodiment, as hereinabove described, it follows that the soft spray nozzle 30 and the rinse nozzle 40 discharge the cleaning mist and the rinsing deionized water respectively in the state separated from each other by a prescribed distance, whereby the cleaning mist and the rinsing deionized water can be prevented from interfering with each other before reaching the substrate W.

Further, the shield 26 separates the soft spray nozzle 30 and the rinse nozzle 40 from each other, whereby the cleaning mist and the rinsing deionized water can be further effectively prevented from interfering with each other before reaching the substrate W.

In addition, the soft spray nozzle 30 and the rinse nozzle 40 vertically discharge the detergents respectively, whereby the discharged detergents have no horizontal kinetic energy and can be inhibited from peripheral scattering resulting from splashing or the like before reaching the substrate W.

Thus, it follows that the cup 15 correctly recovers all of the used detergents, which in turn can be prevented from being scattered at wide angles. Consequently, there is no possibility of a problem such as formation of particles or device defect resulting from scattered detergents adhering to an introduction port for the substrate W or a peripheral device.

3. Modifications

While the embodiments of the present invention have been described, the present invention is not restricted to the aforementioned embodiments but can be modified in various ways.

For example, while the nitrogen gas is employed as the gas for forming the cleaning mist in each of the aforementioned embodiments, any gas such as air is employable so far as the same is employed in a general double-fluid nozzle.

While the deionized water is employed as the detergent for covering the substrate surface with the liquid film for suppressing formation of defects in each of the aforementioned embodiments, the present invention is not restricted to this but functional water such as ozone water prepared by dissolving ozone in deionized water or hydrogen water prepared by dissolving hydrogen in deionized water may alternatively be employed. Further, a liquid of the same type as the detergent employed for forming the cleaning mist may be employed as the detergent covering the substrate surface with the liquid film for suppressing formation of defects.

While the deionized water is employed as the detergent for forming the cleaning mist, the present invention is not restricted to this but an acid solution, an alkaline solution or a removing liquid removing organic matter adhering to the substrate may alternatively be employed. Organic matter such as a polymer which is a reaction product formed by alteration of a resist film formed on the substrate resulting from dry etching or the like adheres onto the substrate. When discharging deionized water or the like for forming a liquid film while discharging a cleaning mist of the removing liquid for removing such organic matter adhering to the substrate, the cleaning mist of the removing liquid splashed on the substrate is prevented from directly re-adhering onto the substrate and being dried.

The removing liquid for the polymer includes an organic amine-based removing liquid containing organic amine such as dimethylsulfoxide or dimethylformamide, an ammonium fluoride-based removing liquid containing ammonium fluoride or an inorganic removing liquid.

The organic amine-based removing liquid includes a mixed solution of monoethanolamine, water and aromatic triol, a mixed solution of 2-(2-aminoethoxy)ethanol, hydroxylamine and catechol, a mixed solution of alkanolamine, water, dialkylsulfoxide, hydroxylamine and an amine-based anticorrosive, a mixed solution of alkanolamine, glycol ether and water, a mixed solution of dimethylsulfoxide, hydroxylamine, triethylene tetramine, pyrocatechol and water, a mixed solution of water, hydroxylamine and pyrogallol, a mixed solution of 2-aminoethanol, ether and sugar alcohol or a mixed solution of 2-(2-aminoethoxy)ethanol, N-dimethyl acetoacetamido, water and triethanolamine.

The ammonium fluoride-based removing liquid includes a mixed solution of organic alkali, sugar alcohol and water, a mixed solution of a fluorine compound, organic carboxylic acid and an acid-amide-based solvent, a mixed solution of alkylamide, water and ammonium fluoride, a mixed solution of dimethylsulfoxide, 2-aminoethanol, an organic alkaline solution and aromatic hydrocarbon, a mixed solution of dimethylsulfoxide, ammonium fluoride and water, a mixed solution of ammonium fluoride, triethanolamine, pentamethyl diethylenetriamine, iminodiacetic acid and water, a mixed solution of glycol, alkyl sulfide, organic salt, organic acid and inorganic salt or a mixed solution of amide, organic salt, organic acid and inorganic salt.

The inorganic removing liquid includes a mixed solution of water and a phosphoric acid derivative.

While only a single rinse nozzle is provided in each of the aforementioned embodiments, a plurality of rinse nozzles may alternatively be provided. The plurality of rinse nozzles are set on positions (e.g., the rotation upstream side of the substrate W) capable of covering a portion around the reaching point of the cleaning mist, so that formation of watermark defects can be effectively suppressed.

While the soft spray nozzle 30 and the rinse nozzle 40 simultaneously start and stop discharging the detergents in each of the aforementioned embodiments, discharge of the rinsing deionized water may be started in advance of discharge of the cleaning mist and may be stopped after stopping discharge of the cleaning mist. In this case, the reaching point of the cleaning mist is reliably covered with the liquid film of the rinsing deionized water, so that formation of watermark defects can be more effectively suppressed.

While the discharge ports 31 and 41 of the soft spray nozzle 30 and the rinse nozzle 40 are fixed to the same arm 21 at the prescribed distance D in each of the aforementioned embodiments, the soft spray nozzle 30 and the rinse nozzle 40 may be moved so that the discharge ports 31 and 41 hold at least a prescribed distance. For example, the soft spray nozzle 30 and the rinse nozzle 40 may alternatively be fixed to different arms to be moved independently of each other.

Figure 7:
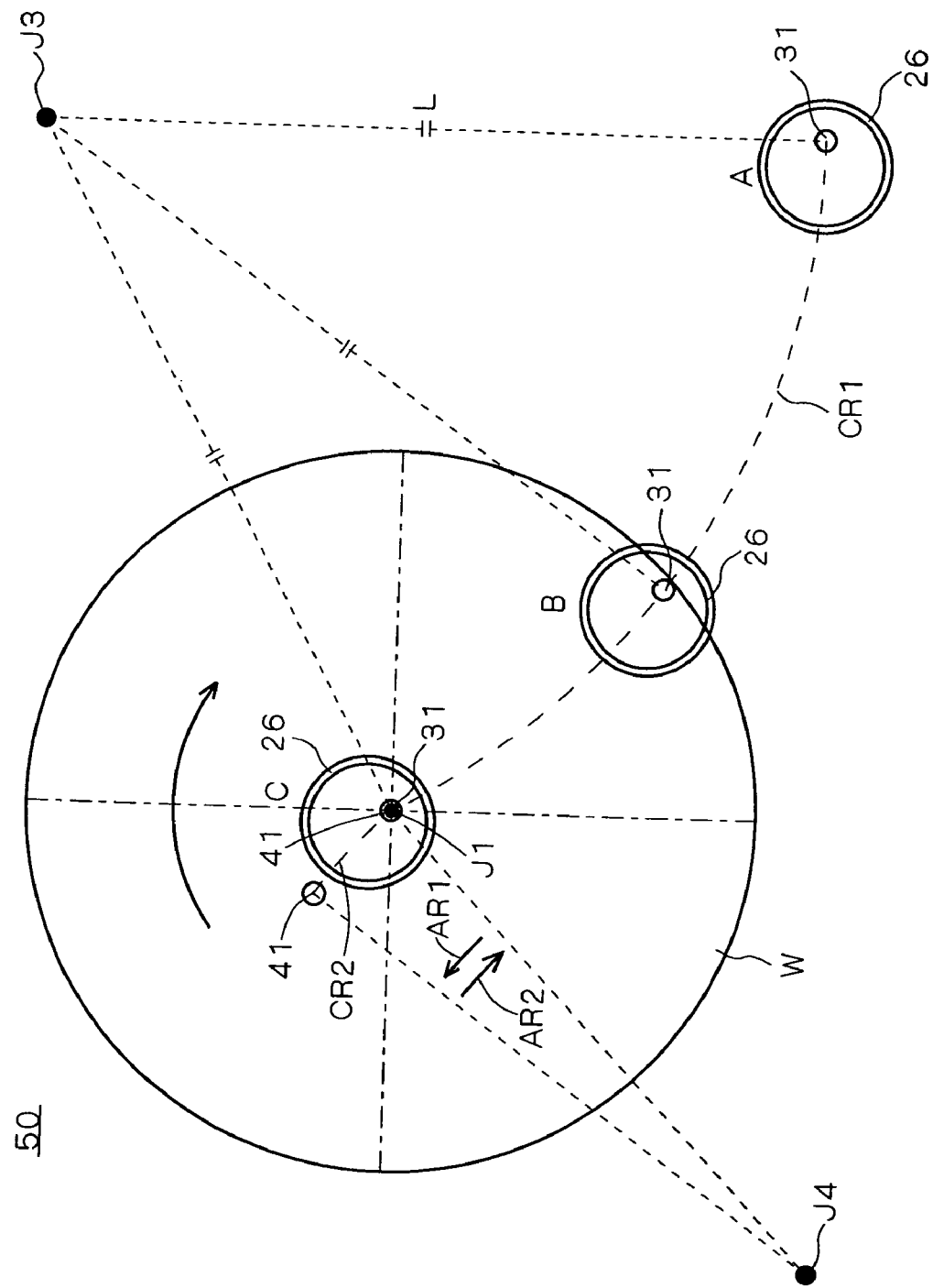
FIG. 7 is a top plan view of a substrate cleaning part in a substrate cleaning apparatus provided with a plurality of arms.

FIG. 7 is a top plan view of a substrate cleaning part 50 of a substrate cleaning apparatus having such a structure. Similarly to FIG. 6, FIG. 7 illustrates only discharge ports 31 and 41 of a soft spray nozzle 30 and a rinse nozzle 40 along with a shield 26 for convenience of illustration, and denotes elements having functions similar to those of the aforementioned embodiments by the same reference numerals.

The soft spray nozzle 30 and the shield 26 are fixed to an arm (hereinafter referred to as "first arm") rotated about an axis J3 in FIG. 7 to hold relative arrangement relation similarly to those of the aforementioned embodiments. Rotation of the first arm is similar to the rotation of the arm 21 of each of the aforementioned embodiments.

The rinse nozzle 40 is not fixed to the first arm but fixed to the forward end of another arm (hereinafter referred to as "second arm") rotated about an axis J4 in FIG. 7 while vertically directing the discharge port 41 thereof. Due to rotation of the second arm, it follows that the rotation locus of the discharge port 41 of the rinse nozzle 40 draws a circular arc CR2.

In cleaning processing, the first arm is moved (to a position B) to locate the discharge port 31 of the soft spray nozzle 30 on the peripheral edge of a substrate W, while the second arm is moved to locate the discharge port 41 of the rinse nozzle 40 immediately above a rotation center J1 of the substrate W.

In this state, the nozzles 30 and 40 start discharging detergents. Rinsing deionized water reaches the rotation center J1 of the substrate W and thereafter spreads on the overall substrate W due to rotational centrifugal force. Thus, it follows that a cleaning mist is discharged to the substrate W covered with a liquid film of the rinsing deionized water, thereby suppressing formation of watermark defects.

When the forward end of the first arm approaches a position C, the forward end o the second arm is moved along arrow AR1 in FIG. 7 in association therewith. More specifically, the forward end of the second arm is so rotated that the space between the discharge ports 31 and 41 exceeds a prescribed distance. When the forward end of the first arm is moved to the position B, the forward end of the second arm is moved along arrow AR2 in FIG. 7 in association therewith, whereby it follows that the discharge port 41 is located immediately above the rotation center J1 of the substrate W.

Also in this substrate cleaning apparatus, the processing solutions can be prevented from scattering resulting from interference between the cleaning mist and a detergent while suppressing formation of watermark defects resulting from the cleaning mist discharged toward the substrate W.

This substrate cleaning apparatus must be provided with arms for the respective nozzles 30 and 40 and must individually control rotation of the arms, leading to a complicated structure. Therefore, the structure of the substrate cleaning apparatus I according to the aforementioned second embodiment is more preferable in the point of the simple structure of fixing the nozzles 30 and 40 to a single arm.

While the reaching point of the rinsing deionized water discharged from the rinse nozzle 40 on the substrate W includes the rotation center J1 of the substrate W in each of the aforementioned first and second embodiments, the present invention is not restricted to this but the liquid film of the deionized water may be formed in a range necessary for suppressing watermark defects.

The techniques of the present invention may be further applicable to rinsing processing to be performed after processing for supplying a certain chemical solution. Such rinsing processing includes a processing to be performed after removal of a polymer attached to a substrate by supplying a removing liquid for the polymer to the substrate, and a processing to be performed after etching of an oxide film and the like by supplying an etching solution, for example.

While the invention has been shown and described in detail, the foregoing description is in all aspects illustrative and not restrictive. It is therefore understood that numerous modifications and variations can be devised without departing from the scope of the invention.

What is claimed is:

1. A substrate cleaning method for cleaning a substrate held on a rotary base while rotating said substrate in a substantially horizontal plane, said method comprising steps of:

discharging a first detergent liquid from a first discharge element onto said substrate and forming a liquid film on a prescribed region of said substrate; and moving a second discharge element for discharging a cleaning mist formed by mixing a second detergent liquid and pressurized gas with each other onto said prescribed region of said substrate provided with said liquid film thereon from said second discharge element by said first discharge element, wherein said first discharge element is movable to form said liquid film of said first detergent liquid on said prescribed region of said substrate, said second discharge element is movable so that a reaching point of said cleaning mist on said substrate passes through a rotation center of said substrate, and said first and second discharge elements are movable so that said first detergent liquid and said cleaning mist do not interfere with each other before reaching said substrate, and wherein discharge of said first detergent liquid and said cleaning mist is started while said first and second discharge elements are located at the vicinity of a peripheral edge portion of said substrate at a start of cleaning, and said first and second discharge elements are thereafter moved toward the rotation center of said substrate.

2. The substrate cleaning method according to claim 1, wherein said first and second discharge elements are moved to reach points on said substrate that are kept at least a prescribed distance from each other.

3. The substrate cleaning method according to claim 2, wherein said first discharge element substantially vertically discharges said first detergent liquid.

4. The substrate cleaning method according to claim 1, wherein after said first and second discharge elements reach the rotation center of said substrate, said first and second discharge elements are reciprocally moved between said peripheral edge portion and said rotation center while causing discharge of said first detergent liquid and said cleaning mist.

5. The substrate cleaning method according to claim 1, wherein said first detergent liquid is selected from a group consisting of deionized water and functional water.

6. The substrate cleaning method according to claim 5, wherein
said second detergent liquid is selected from a group consisting of deionized water, an acid solution, an alkaline solution and a liquid that removes organic matter adhering to said substrate.

7. The substrate cleaning method according to claim 1, wherein
said first detergent liquid and said second detergent liquid are liquids of a same type.

* * * * *